(12) United States Patent
Stark et al.

(10) Patent No.: US 11,014,453 B2
(45) Date of Patent: May 25, 2021

(54) METHOD FOR TESTING WHETHER A CURRENT COLLECTOR IS IN CONTACT, AND CURRENT COLLECTOR

(71) Applicant: SIEMENS MOBILITY GMBH, Munich (DE)

(72) Inventors: Thomas Stark, Woltersdorf (DE); Florian Buehs, Berlin (DE)

(73) Assignee: Siemens Mobility GmbH, Munich (DE)

( * ) Notice: Subject to any disclaimer, the term of this patent is extended or adjusted under 35 U.S.C. 154(b) by 0 days.

(21) Appl. No.: 16/643,652

(22) PCT Filed: Aug. 23, 2018

(86) PCT No.: PCT/EP2018/072706
§ 371 (c)(1),
(2) Date: Mar. 2, 2020

(87) PCT Pub. No.: WO2019/042848
PCT Pub. Date: Mar. 7, 2019

(65) Prior Publication Data
US 2020/0238833 A1 Jul. 30, 2020

(30) Foreign Application Priority Data
Sep. 1, 2017 (DE) .............................. 102017215340

(51) Int. Cl.
*G01R 31/00* (2006.01)
*B60L 3/12* (2006.01)
(Continued)

(52) U.S. Cl.
CPC ................... *B60L 3/12* (2013.01); *B60L 5/30* (2013.01); *G01D 5/14* (2013.01); *G01R 31/006* (2013.01)

(58) Field of Classification Search
CPC ............ B60L 5/30; G01D 5/14; G01R 31/006
See application file for complete search history.

(56) References Cited

U.S. PATENT DOCUMENTS 5,531,301 A * 7/1996 Makino ..................... B60L 5/00
191/55
8,210,326 B2 7/2012 Kim
(Continued)

FOREIGN PATENT DOCUMENTS

DE 19529070 A1 2/1997
DE 102009009281 A1 4/2010
(Continued)

*Primary Examiner* — Alvaro E Fortich
(74) *Attorney, Agent, or Firm* — Laurence Greenberg; Werner Stemer; Ralph Locher (57) ABSTRACT

A method for testing whether a current collector of a vehicle, which is preferably not rail-bound and is driven by an electric motor, is in contact with a contact wire of an overhead line which extends in a direction of travel. The current collector, which can be moved along a vertical direction, has a carrier element and a contact strip, resiliently mounted on the carrier element by a primary spring element. The contact strip, upon contacting the contact wire, is deflected relative to the carrier element counter to the vertical direction out of a resting position, wherein the deflection is detected by a sensor unit and it is determined whether the contact strip is in contact with the contact wire. There is also described a corresponding current collector.

20 Claims, 3 Drawing Sheets

(51) Int. Cl.
  *B60L 5/30* (2006.01)
  *G01D 5/14* (2006.01)

(56) References Cited

U.S. PATENT DOCUMENTS

| | | | |
|---|---|---|---|
| 2004/0110205 A1 | 6/2004 | Wang | |
| 2011/0139561 A1* | 6/2011 | Sommer | B60L 5/39 191/49 |
| 2014/0138200 A1* | 5/2014 | Dronnik | B60L 5/36 191/59.1 |
| 2014/0232191 A1* | 8/2014 | Doelling | B60M 3/04 307/42 |

FOREIGN PATENT DOCUMENTS

| | | | |
|---|---|---|---|
| DE | 102009036963 A1 | 2/2011 | |
| DE | 102011076620 A1 | 11/2012 | |
| DE | 102013201534 A1 | 7/2014 | |
| JP | 2001235310 A | 8/2001 | |
| JP | 2002328063 A | 11/2002 | |
| RU | 164137 U1 | 8/2016 | |

* cited by examiner

METHOD FOR TESTING WHETHER A CURRENT COLLECTOR IS IN CONTACT, AND CURRENT COLLECTOR

BACKGROUND OF THE INVENTION

Field of the Invention

The invention relates to a method for testing whether a current collector is in contact with a contact wire, and a current collector.

Nowadays, in the context of electrification in the automobile sector, different types of electrical energy supply to electric motor-driven vehicles are used. One of these types is, for example, a supply to such a vehicle by means of an overhead line arranged over a roadway, as is typically used with rail vehicles. For energy supply, vehicles configured therefor, in particular, heavy goods vehicles have a current collector which contacts the overhead line and thereby ensures the energy supply.

Bringing the current collector into contact with the overhead line is to be ensured not only from a functional standpoint, but from a technical safety standpoint also, a functioning contacting of the current collector with the overhead line is important.

SUMMARY OF THE INVENTION

Proceeding therefrom, it is an object of the invention to provide a method with the aid of which, a bringing into contact of a current collector with an overhead line can be easily detected, and to provide a current collector which is configured to carry out the method.

The object as far as the method is concerned is achieved, according to the invention, by means of a method having the features as claimed.

Advantageous embodiments, developments and variants are the subject matter of the subclaims.

The method is configured for testing whether a current collector of an electric motor-driven vehicle is in contact with a contact wire of an overhead line extending in a direction of travel. The current collector is configured, in particular, as a pantograph. The contact wire is typically arranged above a roadway by means of a plurality of suspension cables for electrical supply to the electric motor-driven vehicle.

An electric motor-driven vehicle should be understood herein to be, in general, a (passenger) motor vehicle and, in particular a heavy goods vehicle and/or a bus, which has an electric motor as the drive motor, either in the manner of a hybrid vehicle (combination of combustion engine and electric motor) or in the manner of a purely electric motor-driven vehicle. Preferably, the electric motor-driven vehicle described is not rail-bound and is therefore designed to travel on a, for example, asphalted roadway. For the sake of simplicity, the electric motor-driven vehicle is denoted hereinafter as a vehicle, for short.

The current collector is movable in a vertical direction and counter thereto, i.e. in particular, upwardly and downwardly, and comprises a carrier element. The carrier element is typically designated a rocker or a rocker frame. Furthermore, the carrier element is configured as a transverse strip, that is, oriented transversely, in particular perpendicularly, to the contact wire. In particular, the carrier element is also oriented perpendicularly to the vertical direction.

Furthermore, the current collector comprises a contact strip resiliently mounted on the carrier element by means of at least one primary spring element, for example, a helical spring element. The contact strip is preferably also configured as a transverse strip oriented parallel to the carrier element, that is, transversely to the direction of travel and serves for contact with the contact wire. In other words: the contact strip taps off a (supply) voltage that is typically applied to the contact wire. For this purpose, the contact strip is moved toward the contact wire in the vertical direction and, in particular, from below and, during travel, slides along it. Preferably, the vehicle has two contact strips arranged spaced apart, one behind the other.

In addition, the current collector has a sensor unit for detecting the contacting of the current collector and, in particular, of the contact strip with the contact wire. This means that the contact strip, upon contacting the contact wire, is deflected out of a rest position counter to the vertical direction relative to the carrier element. Herein, the expression rest position should be understood to mean specifically a position of the current collector, in particular, a position of the contact strip relative to the carrier element in which the contact strip is positioned force-free—with the exception of gravity—for example, with the current collector retracted. The deflection relates to the principle that during contacting, the contact strip is pressed with a pressing force "from below" against the contact wire. The pressing force is also termed the contact force. However, the contact wire itself also exerts a counterforce on the contact strip. In other words: due to the arrangement by means of the suspension cables and the intrinsic weight of the contact wire, the wire hardly yields in the vertical direction when the contact strip is moved "from below" against the contact wire. Thus the primary spring elements have a force applied to them and the contact strips are deflected relative to the carrier element. The deflection of the contact strip relative to the carrier element corresponds to a distance between the contact strip and the carrier element. The distance, i.e. the deflection, is dependent, in particular, on the pressing force and the corresponding counterforce. In particular, in the presence of a greater pressing force, that is, a stronger pressing of the contact strip against the contact wire, the deflection is reduced, i.e. lessened. Conversely, with a corresponding unloading, the deflection is increased.

This deflection is detected by means of the sensor unit and it is subsequently determined whether the contact strip is contacted by the contact wire. This takes place, for example, by means of a comparison of the deflection with a deflection threshold value. The "deflection threshold value" should be understood herein to mean specifically a deflection beyond which, in particular, a functional contacting of the contact strip with the contact wire has taken place.

By means of the sensor unit, it is therefore detected whether and preferably to what extent the deflection changes, i.e. whether and preferably by how much the deflection lessens or increases. In other words: the deflection is changed during the contacting, i.e. increased or decreased, and the sensor unit detects the changed deflection and preferably also quantifies it.

By this means, a detection of a functional contacting of the contact strip to the contact wire and thus a functional electrical supply to the vehicle is ensured. Furthermore, the testing of the contacting is independent of an electrical state of the contact wire. The electrical state should be understood herein to be an operational state of the contact wire, i.e. whether the contact wire has the (supply) voltage applied to it or not.

Preferably, the sensor unit has a magnet element and a magnetic sensor element. The magnet element and the magnetic sensor element are preferably displaceable or movable relative to one another during the deflection.

In order to enable a simple detection of the deflection, according to a suitable embodiment, a deflection of the primary spring element in, or counter to, the vertical direction is detected. This enables a simple detection of the contacting of the contact strip by the contact wire.

Furthermore, an inclination of the contact strip relative to the carrier element about an inclination axis extending in the direction of travel is preferably detected. The advantage of this embodiment is that alternatively or in addition to the detection of the deflection of the primary spring element, a detection of an inclination angle defined by the inclination of the contact strip can also take place.

According to a suitable development, the contact strip is resiliently arranged on the carrier element by means of two primary spring elements spaced apart from one another. Preferably, a primary spring element is arranged on each side (seen in the direction of travel, to left and right) on the carrier element.

The advantage is that, in particular, the detection of the inclination of the contact strip takes place more exactly than, for example, in an embodiment with only one spring element. Preferably, two sensor units are also provided thereby. In other words: in order to detect the inclination of the contact strip, according to the embodiment described, two deflections (one for each spring element) are used. In a particularly preferred embodiment, a sensor unit is arranged close to each of the primary spring elements. Thereby, "close" should be understood, in particular, as meaning that the sensor unit is arranged not more than 5 cm from the associated primary spring element.

Preferably, the primary spring elements are configured such that when the contact strip makes contact with the contact wire, said spring elements are deflected counter to the vertical direction. Hereby, the deflection of the primary spring elements is detected.

Preferably, the magnet element and the magnetic sensor element are provided for the detection of the deflection. The elements (magnet element and magnetic sensor element) are preferably arranged, in particular held, distributed on the contact strip and on the carrier element. "Distributed" should be understood herein, in particular, to mean that an element selected from a magnet element and a magnetic sensor element is arranged on the contact strip and the respective other element selected from a magnet element and a magnetic sensor element is arranged on the carrier element.

Alternatively or additionally, a plurality of magnet elements and magnetic sensor elements corresponding thereto are provided and also arranged for detecting the deflection. By this means, the detection is still further improved.

The magnet element, for example, a permanent magnet, emits a magnetic field which can be, and also is, detected by the magnetic sensor element. In a deflection of the contact strip relative to the carrier element, that is, a deflection of the primary spring element, the elements (magnet element and magnetic sensor element) are also displaced, i.e. moved, relative to one another. It is therefore made possible that the deflection is determined, dependent upon a magnetic field of the magnet element detected by the magnetic sensor element.

In a suitable embodiment, the magnetic sensor element is configured as a sensor element on the basis of a magnetoresistive effect. In the description of the concepts below, these are based upon such an embodiment utilizing the magnetoresistive effect, but without any loss of generality. The aforementioned concepts, however, are also usable analogously for embodiments with sensor units of different functional methods or design types, in particular, with other magnetic sensor elements which utilize alternative or additional other effects. In a suitable embodiment, the magnetic sensor element is configured as a Hall effect sensor which detects a voltage which is dependent, in particular, upon the magnetic field of the magnet element and is applied to the magnetic sensor element. As further alternatives, sensor units are used which utilize a so-called anisotropic magnetoresistive effect (AMR) or a giant magnetoresistance effect (GMR), whereby however, the detection of the deflection and the design of the sensor unit can differ from the concepts set out below.

The magnetic sensor element is designed, as mentioned above, for detecting magnetic fields. For this purpose, the magnetic sensor element preferably has at least two layers of a ferromagnetic material which are separated by an intermediate layer of a non-ferromagnetic material. In an arrangement of this type, the magnetizations of the two layers of ferromagnetic material orient themselves in opposing directions dependent upon a thickness of the non-ferromagnetic intermediate layer. A magnetic field applied from outside the arrangement at least partially reverses the orientation into a different direction. From this is found the "sensitivity" of the sensor unit to magnetic fields. By reason of the fact that an electrical resistance of the arrangement correlates to the orientation of the magnetization, therefore a magnetic field which influences the magnetization is measurable by means of a change in the value of the electrical resistance. Such a change in the magnetization takes place, for example, when the magnetic sensor element is exposed to a magnetic field.

In other words: by means of the deflection opposed to the vertical direction, the magnetic sensor element which is arranged, for example, on the carrier element, is exposed to the magnetic field of the magnet element, by means of which the magnetization and thus also the value of the electrical resistance of the magnetic sensor element changes. For example, the value of the resistance rises with increasing deflection. This value change of the electrical resistance is subsequently detected, for example, by means of an evaluating unit connected wire-bound to the magnetic sensor element and it is determined whether the contact strip is in functional contact with the contact wire. For this purpose, for example, a resistance threshold value is stored in the evaluating unit, on exceeding of which a functional contacting is detected, that is, recognized.

The sensitivity of the magnetic sensor element to magnetic fields is not restricted in the present case to a particular orientation of the magnetic field. By this means, it is also made possible, for example, to detect the inclination of the contact strip by means of the magnetic sensor element in that only subregions of the magnetic sensor element exposed to the magnetic field lead to a measurable change of the electrical resistance of the magnetic sensor element.

Consequently, according to a suitable embodiment, the inclination of the contact strip relative to the carrier element is detected. Furthermore, alternatively or additionally, dependent upon the inclination of the contact strip and the deflection of the primary spring element, a contacting point of the contact wire on the contact strip is detected. "The contacting point" should be understood herein specifically as a point "on" the contact strip with which the contact strip makes contact with the contact wire and thus slides thereon.

In other words: if the current collector, in particular the carrier element, is viewed in the direction of travel, the primary spring elements are preferably arranged at the end on the carrier element and on the contact strip. In particular, by this means, during operation the primary spring elements are arranged on both sides of the contact wire. If the vehicle now moves, for example, to the right (seen in the direction of travel), the contact wire is displaced to the left on the contact strip. By this means, the left primary spring element experiences a greater displacement than the right primary spring element. "Deflection" should be understood herein to be specifically a deflection of the left primary spring element counter to the vertical direction, that is, a compression of the left primary spring element, and specifically for the right primary spring element, a deflection in the vertical direction, that is, a stretching or extension.

The contact strip is thus inclined to the left by an inclination angle about the rotary axis extending in the direction of travel. Consequently, the magnetic sensor element and in particular a left-hand region of the magnetic sensor element is, for example, more strongly exposed to the magnetic field of the magnet element than a right-hand region of the magnetic sensor element. Alternatively, the contact strip is deflected so far to the left that the right-hand region of the magnetic sensor element is not permeated by the magnetic field at all. Making use of the deflections of the two primary spring elements, in particular a deflection resulting from the two deflections and a value of the inclination angle resulting therefrom, a determination of the contacting point (here, in a left-hand region of the contact strip) is achieved. Furthermore, the changed value of the electrical resistance is also taken into account.

For example, a particular deflection value (how far the primary spring elements are each deflected or compressed) and/or a resulting inclination angle in combination with an electrical resistance value of the magnetic sensor element is assigned to each possible contacting point.

According to a suitable development, by means of at least one secondary spring element, for example, a helical spring element, a limiter element is arranged on the contact strip, whereby a deflection of the contact strip and of the limiter element relative to the carrier element on contacting the contact strip with the contact wire is detected. Preferably, the limiter element is arranged by means of two secondary spring elements spaced apart from one another on the contact strip. For this purpose, the secondary spring elements are each arranged at an end side on the limiter element and on the contact strip.

The limiter element also has end regions protruding laterally beyond the contact strip. "End regions" should be understood herein specifically to be ends of the limiter element oriented in the vertical direction and, for example, bent over. In particular, by means of the protruding end regions, a detection of a departure of the contact wire from a permissible region is enabled. "The permissible region" should be understood herein to be a region of the contact strip with which the contact wire must be mechanically in contact in order also to ensure an electrically operational contact. Normally, the permissible region is a width of the contact strip. The width of the contact strip should be understood herein—seen in the direction of travel—to be a lateral extent (to left and right) of the contact strip. As a result of the fact that the contact wire "operates" within the permissible region, the permissible region is typically also designated an operating region and consequently the limiter element is also designated an operating region limiter.

Preferably, the deflection of the contact strip and thus also of the limiter element relative to the carrier element in the form of a deflection of the secondary spring element in and counter to the vertical direction is detected. Furthermore, an inclination of the contact strip and thus also of the limiter element relative to the carrier element about an inclination axis is detected. The inclination axis extends preferably in the direction of travel.

The advantage is that, due to the additional arrangement of the limiter element, the detection of the deflection and the inclination for detecting the contacting of the contact strip with the contact wire and for detecting the contacting point is not influenced.

According to a preferred embodiment, for detecting the deflection and/or the inclination, the magnet element and the magnetic sensor element are provided. According to this embodiment, the elements (magnet element and magnetic sensor element) are arranged distributed on the limiter element and the carrier element. "Distributed" should be understood herein, in particular, to mean that an element selected from a magnet element and a magnetic sensor element is arranged on the limiter element and the respective other element selected from a magnet element and a magnetic sensor element is arranged on the carrier element.

Consequently, the deflection of both the primary spring element and also the secondary spring element as well as the inclination of the contact strip about the inclination axis relative to the carrier element is detected dependent upon the magnetic field of the magnet element detected by the magnetic sensor element.

In addition, a departure of the contact wire from the permissible region from the contact strip and a departure of the contact strip by the contact wire is detected. This will now be described in greater detail using an exemplary procedure:

If the vehicle now moves, for example, to the right (seen in the direction of travel), the contact wire is displaced to the left "on" the contact strip. If the vehicle now moves sufficiently far to the right and consequently the contact wire moves sufficiently far to the left that it "slips" off the contact strip, then the contact wire impinges upon the limiter element which is arranged with two secondary spring elements spaced apart from one another on the contact strip. For this purpose, the limiter element is bent at each end side as previously mentioned, for example, in the vertical direction ("upwardly") such that each—upwardly—bent part of the limiter element abuts the ends of the contact strip.

Through the impinging of the contact wire against the limiter element, in particular on the (upwardly) bent left-hand part of the limiter element, the limiter element is deflected. In the present example, the limiter element is deflected counter to the vertical direction such that it inclines to the left. Thus, for example, the left-hand secondary spring element is deflected counter to the vertical direction and the right-hand secondary spring element is compressed in the vertical direction. A deflection of the primary spring elements relative to the carrier element which results by reason of the contacting of the contact strip by the contact wire and the inclination angle of the contact strip are abruptly changed, for example, on departure of the contact wire from the contact strip. "Abruptly changed" should be understood herein to mean specifically that, for example, if the contact wire departs from the contact strip, the primary spring element rebounds counter to its deflection caused by the contact wire. This "rebounding" also acts on the limiter element arranged by means of the secondary spring element on the contact strip. I.e. the magnet element arranged, for example, on the limiter element also "co-springs", whereby the "co-springing" manifests, for example, as a sudden change of the electrical resistance of the magnetic sensor element.

In other words: the magnetic sensor element "responds to" and detects the exposure to the magnetic field of the magnet element. When the contact wire departs from the contact strip and the aforementioned springing movement of the contact strip and also of the limiter element takes place, the magnetic sensor element is permeated, for example, by a changing magnetic field. This changing permeation (due to the springing motion, the magnetic field passes into the magnetic sensor element and then out again) by the magnetic field also changes the measured electrical resistance of the magnetic sensor element in a sudden manner. Due to this sudden variation of the measured resistance value, subsequently, a departure of the contact wire from the contact strip can be deduced.

Preferably, a contact force with which the contact wire contacts the contact strip is determined by means of the sensor unit, dependent upon the deflection. In particular hereby, the deflection of the primary spring elements is used, since these directly connect the carrier element mechanically to the contact strip that is deflected relative to the carrier element.

In principle, a plurality of suitable possibilities exist for arranging the magnet element and the magnetic sensor element. In a first variant, the two elements are mounted such that they are moved toward one another if the deflection between the contact strip and the carrier element becomes reduced. Hereby, the deflection then correlates to the contact force such that a smaller deflection between the carrier element and the contact strip corresponds to a greater contact force. In the present case, a "smaller deflection" should be understood specifically as a compression of the primary spring elements which are configured, for example, as helical spring elements. In a second variant, the two elements are mounted such that they are moved away from one another if the deflection between the contact strip and the carrier element becomes reduced. Hereby, the deflection then correlates to the contact force such that a larger deflection between the carrier element and the contact strip corresponds to a greater contact force.

Particularly in relation to the above-mentioned second variant, the current collector suitably comprises a holder which is mounted on the contact strip or on the limiter element. The holder is fed round the carrier element and grasps it such that the element (magnetic sensor element or magnet element) fastened to the holder is arranged, in particular, beneath the other element. As a result thereof, on a reduction of the spacing between the contact strip and the carrier element, a spacing between the magnet element and the magnetic sensor element is increased.

It is advantageous that, by means of a sensor unit, two parameters, for example, the contacting of the contact strips to the contact wire and simultaneously, the contact force can be determined and preferably also are determined. Furthermore, a complex sensor unit which is configured, for example, for an optical force measurement can be dispensed with.

The object as far as the current collector is concerned is achieved, according to the invention, by means of a current collector as claimed.

The current collector is configured such that it serves for carrying out the method described above.

The advantages described in relation to the method and preferred embodiments can be applied, mutatis mutandis, to the current collector and vice versa.

The current collector is movable in and counter to a vertical direction and is configured for an electrical supply of a preferably not rail-bound, electric motor-driven vehicle. For this purpose, the current collector makes contact with a contact wire of an overhead line extending in a direction of travel. In particular, the current collector is constructed in the manner of a pantograph.

For this purpose, the current collector has a carrier element, usually termed a rocker frame. The carrier element is configured, in particular, as a transverse strip, that is, oriented transversely, preferably perpendicularly to the contact wire. Furthermore, the current collector comprises a contact strip, resiliently arranged on the carrier element with at least one primary spring element, for contacting the contact wire. The contact strip is therefore deflectable out of the rest position relative to the carrier element on contacting the contact wire.

Herein, "on contacting" should be understood to mean, firstly, a contacting procedure in which the current collector moves in the vertical direction to the contact wire and, secondly, a contacted state of the current collector with the contact wire after said movement toward it. In order to detect the deflection of the contact strip relative to the carrier element, the current collector has a sensor unit whereby, dependent upon the deflection, an evaluation takes place of whether the contact strip is in contact with the contact wire. Furthermore, the contact strip is also configured as a transverse strip and is oriented transversely, preferably perpendicularly, to the contact wire.

The evaluation takes place alternatively or additionally by means of an evaluating unit which is arranged, for example, on a control unit of the current collector or, for example, within the vehicle. The evaluating unit is, hereby, preferably connected by means of a wire-bound or wireless connection to the sensor unit, for example, by means of an electrical line.

Preferably, the sensor unit has a magnet element and a magnetic sensor element.

According to a preferred embodiment, the magnetic sensor element is configured as a magnetoresistive sensor element, for example, as a giant magnetoresistance sensor element (GMR sensor element). The "magnetoresistive sensor element" should be understood in the present case to mean specifically a sensor element which operates on the basis of a magnetoresistive effect. In general, "magnetoresistive effects" should be understood herein to be effects which define a change of an electrical resistance of a material by application of an external magnetic field.

Alternative embodiments of the sensor unit use another functional method or have a different design, in particular, with other magnetic sensor elements which utilize alternative or additional other effects. For example, the magnetic sensor element is configured as a Hall effect sensor which detects a voltage which is dependent, in particular, upon the magnetic field of the magnet element and is applied to the magnetic sensor element. Furthermore, in particular, sensor units are used which utilize, in particular, a so-called anisotropic magnetoresistive (AMR) effect or a giant magnetoresistance (GMR) effect.

Suitably, the magnet element and the magnetic sensor element are arranged distributed on the contact strip and on the carrier element. For example, the magnetic sensor element is arranged on the carrier element and the magnet element is arranged on the contact strip. By this means, a simple detection of the deflection is, for example, by means of an influencing of the electrical resistance of the magnetic sensor element by the magnetic field emitted by the magnet element, as set out above in the description of the method.

According to a preferred development, a limiter element is arranged resiliently mounted on the contact strip by means of at least one secondary spring element, in particular, by means of two secondary spring elements. The limiter element is arranged, in particular, counter to the vertical direction, that is, beneath the contact strip. The limiter element also preferably has end regions at each end side oriented, for example bent, in the vertical direction ("upwardly"). I.e. the end regions extend—seen in the direction of travel—along the lateral ends of the contact strip. Thus, a departure of the contact wire from the contact strip is detectable as described above.

Suitably, the magnet element and the magnetic sensor element are arranged distributed on the limiter element and on the carrier element in the manner already described.

According to an advantageous development, at least two sensor units are provided for measuring the deflection and/or inclination at two different sites. Particularly suitable is an embodiment in which two primary spring elements are arranged and, in the region of each primary spring element, i.e. for example not further than 20 cm or, in particular, not further than 10 cm removed therefrom, a sensor unit is provided, that is, in total two sensor units. In this way, the inclination and/or the deflection can advantageously be determined in an improved manner.

Exemplary embodiments of the invention are explained below in greater detail, making reference to the drawings. Therein, in partially greatly simplified representations:

In the drawings, details having the same function are each provided with the same reference signs.

DESCRIPTION OF THE INVENTION

Figure 1:
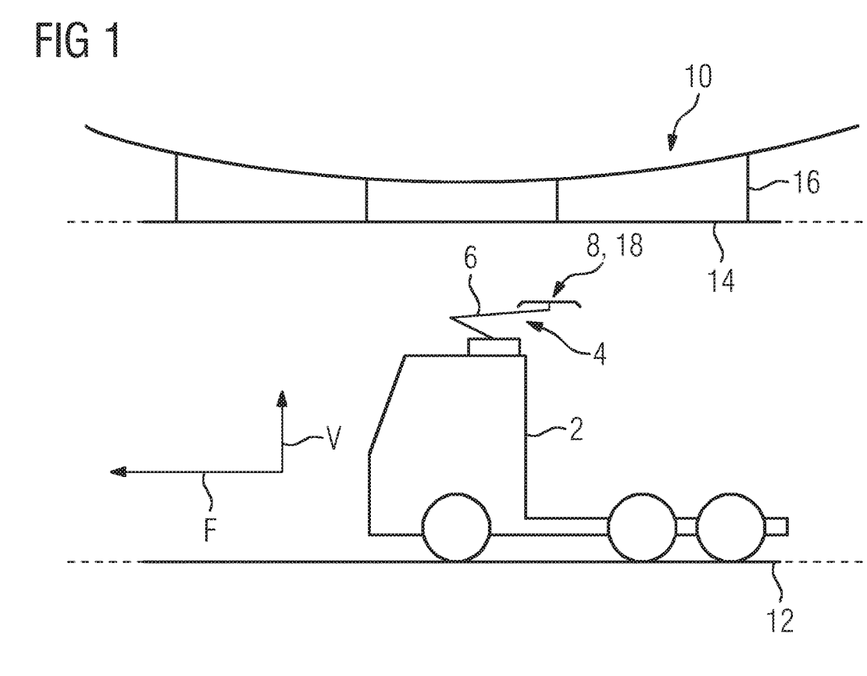
FIG. 1 is a schematic side view of an electric motor-driven vehicle.

The vehicle 2 shown in FIG. 1 has a current collector 4 which, in the exemplary embodiment is arranged on the roof of the vehicle 2. The current collector 4 has a current collector arm 6 and a carrier element 8 arranged at one end of the current collector arm 6. With the other end, the current collector arm 6 is arranged on the roof of the vehicle 2.

The current collector 4 is movable in and counter to a vertical direction V and serves for electrical supply to the vehicle 2 with an (operational) voltage. The voltage is typically provided by means of an overhead line 10. The overhead line 10 extends in a direction of travel F and is arranged above a roadway 12. Furthermore, the overhead line 10 comprises a contact wire 14 and a plurality of suspension cables 16 for arrangement above the roadway 12. The contact wire 14 typically has the (operational) voltage applied to it.

For tapping off the (operational) voltage, the current collector 4 has contact strips 18 (see FIG. 2) arranged on the carrier element 8. The contact strips 18 are oriented transversely to the contact wire 14 and for the supply of the vehicle 2 are moved in the vertical direction V ("from below") to the contact wire 14. The contact strips 18 thus slide along the contact wire 18 during driving operation and ensure the electrical supply to the vehicle.

Figure 2:
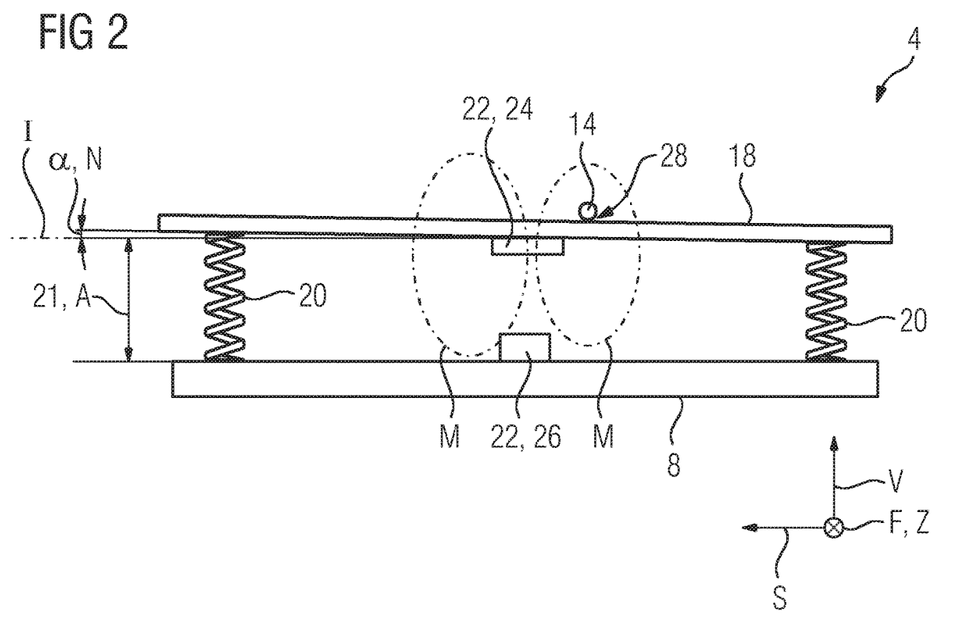
FIG. 2 is a sketched representation of a current collector according to a first variant.

In an alternative (not shown), a further sensor unit 22 is arranged in the region of each of the primary spring elements 20. Herein, the magnet elements 24 are each arranged not further removed than 10 cm from the site at which the associated primary spring element 20 is connected to the contact strip and the magnetic sensor elements 26 are each arranged not further than 10 cm from the site at which the associated primary spring element 20 is connected to the carrier element 8.

FIG. 2 shows a sketched representation of a carrier element 8 seen in the direction of travel F according to a first variant. The contact strip 18 is arranged on the carrier element 8 by means of two primary spring elements 20. In the exemplary embodiment, the contact strip 18 is arranged in the vertical direction, that is, above the carrier element 8. For this purpose, a primary spring element 20 is arranged at each end on a side facing toward the respective other element selected from the carrier element 8 and the contact strip 18. Both the contact strip 18 and the carrier element 8 are configured in the exemplary embodiment as transverse strips and are thus oriented transversely to the contact wire 14.

By means of the primary spring elements 20, the contact strip 18 is mounted resiliently in and counter to the vertical direction V. Furthermore, the contact strip 18 has a spacing A from the carrier element 8. In order to detect a deflection of the contact strip 18 on contacting by the contact wire 14, the current collector 4, in particular, the carrier element 8 has a sensor unit 22. The sensor unit 22 has a magnet element 24, for example, a permanent magnet element and a magnetic sensor element 26, for example, a giant magnetoresistance element.

In the exemplary embodiment, the magnet element 24 is arranged centrally on the contact strip 18 and emits a permanent magnetic field M. In the exemplary embodiment, the magnetic sensor element 26 is arranged on the carrier element 8 and is configured for detection of the magnetic field M.

When the current collector 4, in particular, the contact strip 18 moves toward the contact wire 14, the contact strip 18 is "pressed" against the contact wire 14. The contact strip 18 and thus also the primary spring element 20 are deflected relative to the carrier element 8, in particular, counter to the vertical direction V. Thus, the spacing A is reduced. As a result thereof, a position of the magnet element 24 relative to the magnetic sensor element 26 changes, whereby the magnetic sensor element 26 detects a magnetic field change. For example, the magnetic field strength of the magnetic field M increases as the spacing A decreases. Thus, on a deflection by means of a contacting of the contact strip 18 by the contact wire 14, the magnetic sensor element 26 is subjected to a stronger magnetic field M than, for example, in a rest position. "Rest position" should be understood herein to be a position of the current collector 4 and, in particular, of the contact strip 18 in which the contact strip 18 is, for example, not in contact with the contact wire 14. The stronger magnetic field M has the consequence, for example, within the magnetic sensor element 26 of an increase in the electrical resistance of the magnetic sensor element 26, whereby such a change is detectable.

For example, stored in an evaluating unit (not shown here) is a threshold value of the electrical resistance, on exceeding of which a functional contacting of the contact strip 18 with the contact wire 14 takes place.

In addition, the arrangement described also detects an inclination of the contact strip 18 by an inclination angle α. For this purpose, dependent upon a displacement of the contact wire 14 in or counter to a lateral direction S, a deflection of the—seen in the direction of travel F—left-hand primary spring element 20 and of the right-hand primary spring element 20 is determined. A different deflection of the two primary spring elements 20, for example, due to a non-central contacting of the contact strip 18—seen in the direction of travel F—with the contact wire 14 is decisive for a value of the inclination angle α. In other words: if—as seen in the direction of travel F—a right-hand region of the contact strip 18 makes contact with the contact wire 14, then the right-hand primary spring element 20 is more strongly deflected counter to the vertical direction than the left-hand primary spring element 20. The contact strip 18 therefore inclines "to the right" which, in the exemplary embodiment, has the consequence of increasing the inclination angle α and an inclination of the magnet element 24. At the same time, due to the inclination, an orientation of the magnetic field M which permeates the magnetic sensor element 26 changes. In the example described, a right-hand region of the magnetic sensor element is now more strongly permeated by the magnetic field M than a left-hand region (described more exactly in relation to FIG. 4). This unequal magnetic field permeation has the effect, again, of a detectable change in the electrical resistance of the magnetic sensor element 26.

In addition, as a result of a combination of the deflection of the primary spring elements 20 and the inclination angle α, a contacting point 28 of the contact wire 14 "on" the contact strip 18 can be deduced. For this purpose, for example, the different deflections of the primary spring elements 20 are summed into a resultant deflection and, on the basis of the detected parameters (inclination angle α and resulting deflection), the contacting point 28 can be deduced.

Dependent upon a deflection of the primary spring elements 20 and a spring constant of the primary spring elements 20, a contact force with which the contact strip 18 makes contact with the contact wire 14, that is, with which the contract strip 18 presses "against" the contact wire 14, is also determined.

Figure 3:
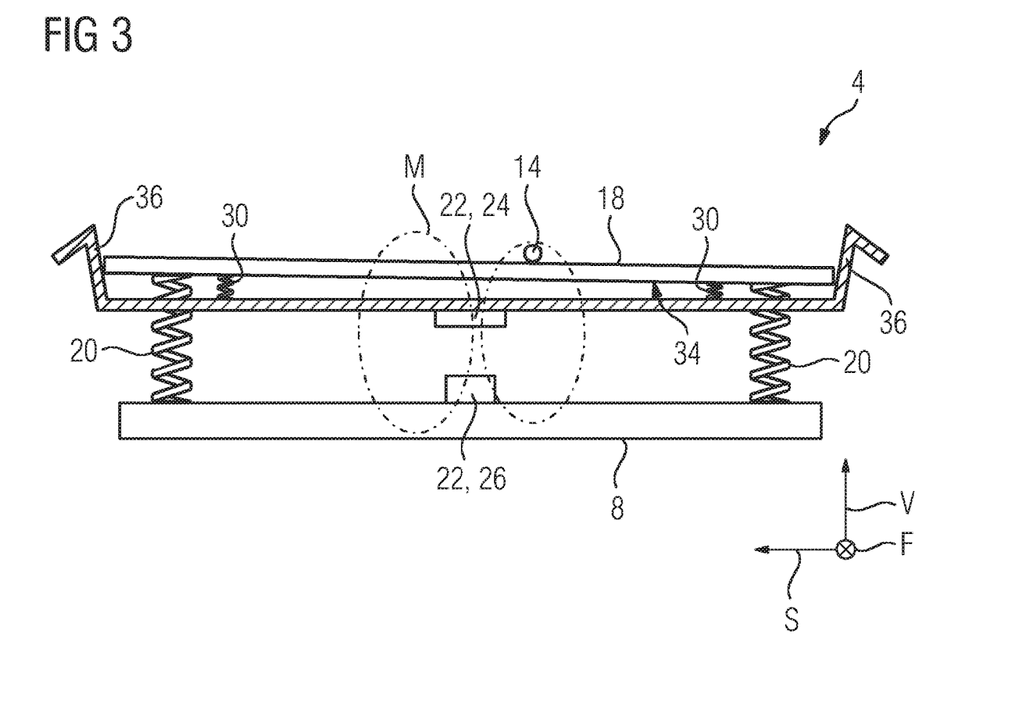
FIG. 3 is a sketched representation of the current collector according to a second variant.

FIG. 3 shows the carrier element 8 according to a second variant. In FIG. 3, the carrier element 8 has all the elements and units 18, 20, 22, 24, 26, as described in relation to the first embodiment.

In addition, however, a limiter element 32 is arranged on the contact strip 18 by means of a number of secondary spring elements 30, in the exemplary embodiment, two. The limiter element 32 is arranged counter to the vertical direction, that is, on an underside 34 of the contact strip 18. By means of the secondary spring elements 30, the limiter element 32 is also mounted resiliently in and counter to the vertical direction V and is therefore deflectable relative to the carrier element 8 and the contact strip 8.

On each end side, the limiter element 32 has end regions 36 which are, for example, bent, oriented in the vertical direction V, that is upwardly. The end regions 36 thus surround (due to the arrangement of the limiter element 32 "underneath" the contact strip 18) the contact strip 18. In other words: due to the fact that the end regions 36 are upwardly oriented, they "protrude" laterally past the ends of the contact strip 18.

Furthermore, according to the second variant, the magnet element 24 is arranged on the limiter element 32. Due to the arrangement of the limiter element 32 on the contact strip 18, whereby the limiter element 32 is therefore also deflected relative to the carrier element 8 on contacting of the contact wire 14 on the contact strip 18, a determination of the contacting of the contact strip 18 with the contact wire 14 is ensured similarly to the first variant.

Underlying the second variant is the concept that in addition, a departure of the contact wire 14 from the contact strip 18 can be detected. "Departure" should be understood herein particularly as a lateral "sliding down" of the contact wire 14 from the contact strip 18.

The detection of the departure will be described in greater detail with an example by reference to FIG. 4.

Figure 4:
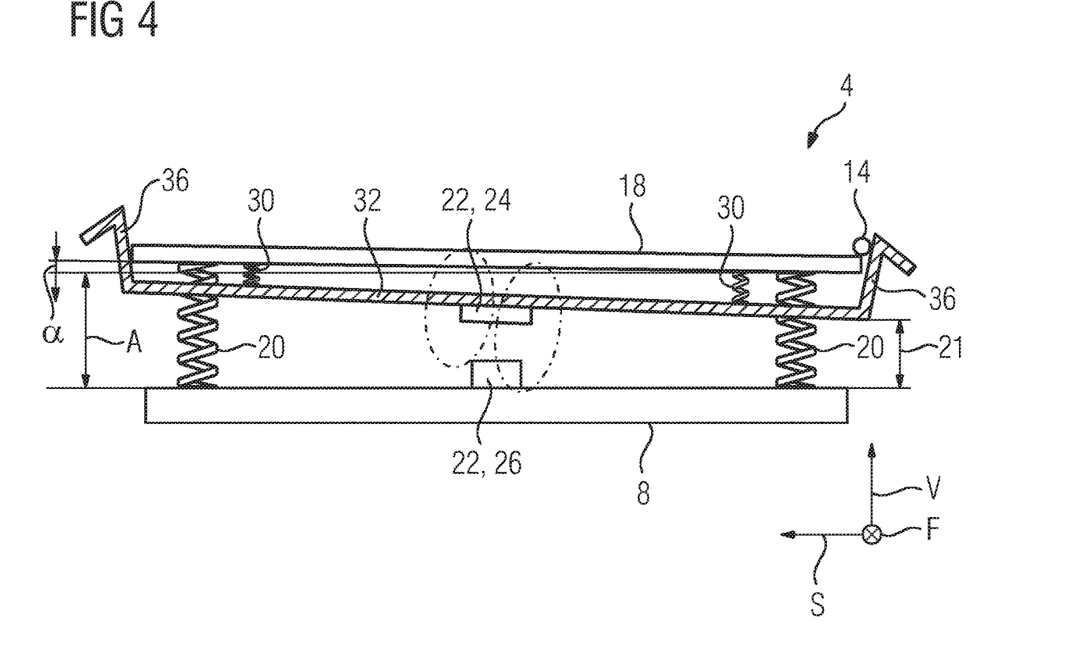
FIG. 4 is a sketched representation of the carrier element according to the second variant in a deflected state.

FIG. 4 shows the carrier element 8 of the current collector 4 and the contact strip 18, whereby the contact strip 18 is laterally deflected, as seen in the direction of travel F. As already described by reference to FIG. 3, in the following, the method for detecting the departure of the contact wire 14 from the contact strip 18 will be described in greater detail:

If, for example, the vehicle 2 now moves during driving operation (and thus with a contacted connection of the contact strip with the contact wire 14), to the left, as seen in the direction of travel, the contact wire 14 is displaced to the right on the contact strip 18. If the vehicle 2 does not end the displacement to the left, the contact wire 14 leaves the contact strip 18 in a right-hand region.

Due to the fact that the end regions 36 of the limiter element 32 protrude past the ends of the contact strip 18, the contact wire 14 "presses" against the relevant end region 36, in the exemplary embodiment, the right-hand end region 36. This results in a deflection of the limiter element 32 relative to the carrier element 8. In the exemplary embodiment, the right-hand secondary spring element 30 is deflected counter to the vertical direction V and the limiter element 32 inclines, forming the inclination angle α, to the right. Due to the fact that the magnet element 24 is arranged on the limiter element 32, this inclines similarly and thus also permeates the magnetic sensor element 26 arranged on the carrier element 8, as previously described, with an "inclined" magnetic field M.

Since both the departure of the contact strip 18 and also a (usually uncritical) displacement of the contact wire 14 on the contact strip 18 causes a deflection of the magnet element 24 and thus an inclined magnetic field M, the departure of the contact strip 18 is to be distinguished from the displacement of the contact wire 14.

For this purpose, for example, a variation of the resistance change of the magnetic sensor element resulting from the magnetic field permeation is tracked. This consideration is based thereon that, on a departure of the contact wire 14 from the contact strip 18, as compared with a simple displacement of the contact wire 14, as previously mentioned, a jump is detectable in the variation of the resistance value. Thus, for example, on determining such a jump in the signal variation of the magnetic sensor element, a departure of the contact wire 14 from the contact strip 18 is unambiguously detectable by the aforementioned evaluating unit.

Figure 5:
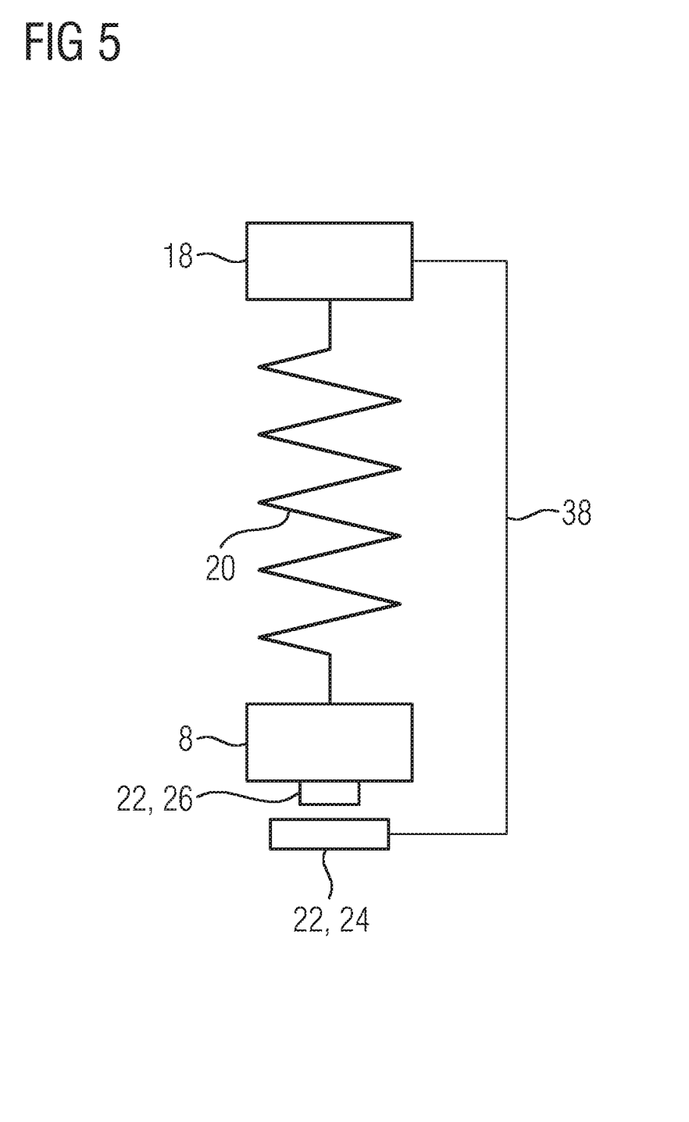
FIG. 5 is a side view of the current collector according to a third variant.

FIG. 5 shows a further variant of the current collector 4 as viewed along the carrier element 8. Herein, a spacing between the magnet element 24 and the magnetic sensor element 26 in the rest state I along the vertical direction V is a minimum. The magnetic sensor element 26 is herein arranged on the side of the carrier element 8 facing away from the contact strip 18, in other words, facing the vehicle 2. In addition, a holder 38 which surrounds the carrier element 8 is arranged on the contact strip 18, so that the magnet element 24 fastened to the holder 38 is arranged spaced from the magnetic sensor element 26 vertically in the direction of the vehicle 2. Thus, on a reduction of the spacing A between the contact strip 18 and the carrier element 8, the spacing between the magnet element 24 and the magnetic sensor element 26 is increased.

In an alternative (not shown in detail) and otherwise identically constructed variant, the magnetic sensor element 26 is fastened to the holder 38 and the magnet element 24 is fastened to the carrier element 8.

Furthermore, in a further alternative embodiment (not shown) of the current collector 4 according to FIG. 3, the limiter element 32 comprises the holder 38 surrounding the carrier element 8.

The invention claimed is:

1. A method for testing whether a current collector of a vehicle is in contact with a contact wire of an overhead line extending in a direction of travel, wherein the current collector is movable in, and counter to, a vertical direction, the method comprising:
providing the current collector with a carrier element and a contact strip for contacting the contact wire resiliently mounted on the carrier element by way of at least one primary spring element, and providing the current collector with a sensor unit;
wherein, upon contacting the contact wire, the contact strip is subject to a deflection out of a rest position counter to the vertical direction relative to the carrier element;
detecting the deflection with the sensor unit of the current collector and, dependent upon the deflection, determining whether the contact strip is in contact with the contact wire.

2. The method according to claim 1, wherein the sensor unit comprises a magnet element and a magnetic sensor element which are displaceable relative to one another during the deflection.

3. The method according to claim 1, which comprises detecting a deflection of the primary spring element in or counter to the vertical direction.

4. The method according to claim 1, which comprises detecting an inclination of the contact strip relative to the carrier element about an inclination axis extending in the direction of travel.

5. The method according to claim 1, wherein the at least one primary spring element is one of two primary spring elements, and the contact strip is resiliently mounted on the carrier element by the two primary spring elements spaced apart from one another.

6. The method according to claim 5, wherein the primary spring elements are configured such that when the contact strip makes contact with the contact wire, the primary spring elements are deflected counter to the vertical direction, and the detecting step comprises detecting the deflection of the primary spring elements.

7. The method according to claim 2, which comprises arranging the magnet element and the magnetic sensor element distributed on the contact strip and on the carrier element and for detecting the deflection of the contact strip relative to the carrier element, determining the deflection of the primary spring element in dependence on a magnetic field of the magnet element detected by the magnetic sensor element.

8. The method according to claim 1, which comprises detecting, by way of the sensor unit, an inclination of the contact strip relative to the carrier element and/or dependent upon the inclination of the contact strip and the deflection of the primary spring element, a contacting point of the contact wire on the contact strip.

9. The method according to claim 1, which comprises providing a limiter element with end regions protruding laterally beyond the contact strip and being supported by at least one secondary spring element, and detecting the deflection of the contact strip and of the limiter element relative to the carrier element.

10. The method according to claim 9, which comprises detecting a deflection of the secondary spring element in and counter to the vertical direction and/or an inclination of the contact strip relative to the carrier element about an inclination axis extending in the direction of travel.

11. The method according to claim 9, wherein the sensor unit comprises a magnet element and a magnetic sensor element which are displaceable relative to one another during the deflection, and the method further comprises arranging the magnet element and the magnetic sensor element distributed on the limiter element and on the carrier element and for detecting the deflection and/or the inclination, and determining the deflection of the secondary spring element and/or the inclination of the contact strip relative to the carrier element in dependence on a magnetic field of the magnet element detected by the magnetic sensor element.

12. The method according to claim 1, which comprises determining a contact force with which the contact wire contacts the contact strip by way of the sensor unit, dependent upon the deflection.

13. A current collector of a vehicle for contacting a contact wire of an overhead line that extends in a direction of travel, the current collector comprising:
a carrier element movably mounted for movement in, and counter to, a vertical direction;
a contact strip for contacting the contact wire;
at least one primary spring element resiliently mounting said contact strip on said carrier element, enabling said contact strip, on contacting the contact wire, to be deflected out of a rest position relative to said carrier element; and
a sensor unit for detecting a deflection of said contact strip relative to said carrier element, thus enabling an evaluation, in dependence on the deflection, whether or not said contact strip is in contact with the contact wire of the overhead line.

14. The current collector according to claim 13, wherein said sensor unit comprises a magnet element and a magnetic sensor element.

15. The current collector according to claim 14, wherein said magnetic sensor element is a magnetoresistive sensor element.

16. The current collector according to claim 14, wherein said magnet element and said magnetic sensor element are arranged distributed on said contact strip and on said carrier element.

17. The current collector according to claim 14, wherein said magnet element and said magnetic sensor element are mounted for movement away from one another when the deflection between said contact strip and said carrier element decreases.

18. The current collector according to claim 13, which comprises a limiter element on said contact strip and at least one secondary spring element resiliently mounting said limiter element on said contact strip.

19. The current collector according to claim 18, wherein said sensor unit comprises a magnet element and a magnetic sensor element, and wherein said magnet element and said magnetic sensor element are arranged distributed on said limiter element and on said carrier element.

20. The current collector according to claim 13, wherein at least two sensor units are arranged for measuring the deflection and/or an inclination at two mutually different sites.

* * * * *